(12) United States Patent
JangJian et al.

(10) Patent No.: US 8,815,630 B1
(45) Date of Patent: Aug. 26, 2014

(54) BACK SIDE ILLUMINATION (BSI) SENSORS, MANUFACTURING METHODS THEREOF, AND SEMICONDUCTOR DEVICE MANUFACTURING METHODS

(71) Applicant: Taiwan Semiconductor Manufacturing Company, Ltd., Hsin-Chu (TW)

(72) Inventors: Shiu-Ko JangJian, Tainan (TW); Chin-Nan Wu, Tainan (TW); Chun Che Lin, Tainan (TW); Yu-Ku Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/772,008

(22) Filed: Feb. 20, 2013

(51) Int. Cl.
*H01L 31/0232* (2014.01)
*H01L 31/18* (2006.01)

(52) U.S. Cl.
USPC ........... 438/69; 438/70; 438/75; 257/E31.127

(58) Field of Classification Search
None
See application file for complete search history.

(56) References Cited

U.S. PATENT DOCUMENTS 7,153,720 B2 * 12/2006 Augusto .................... 438/69
2013/0228886 A1 * 9/2013 JangJian et al. ............ 257/432

* cited by examiner

*Primary Examiner* — Zandra Smith
*Assistant Examiner* — Pamela E Perkins
(74) *Attorney, Agent, or Firm* — Slater and Matsil, L.L.P.

(57) ABSTRACT

Back side illumination (BSI) sensors, manufacturing methods thereof, and semiconductor device manufacturing methods are disclosed. In some embodiments, a method of manufacturing a semiconductor device includes providing a workpiece having a front side and a back side opposite the front side. An integrated circuit is formed on the workpiece, and a first insulating material is formed on the back side of the workpiece. A second insulating material is formed over the first insulating material. The second insulating material is patterned to form a grid on the back side of the workpiece.

20 Claims, 6 Drawing Sheets

BACK SIDE ILLUMINATION (BSI) SENSORS, MANUFACTURING METHODS THEREOF, AND SEMICONDUCTOR DEVICE MANUFACTURING METHODS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

Integrated circuit dies are typically formed on a front side of semiconductor wafers. The integrated circuit dies may comprise various electronic components, such as transistors, diodes, resistors, capacitors, and other devices. The integrated circuit dies may comprise various functions, such as logic memory, processors, and/or other functions.

Complementary metal oxide semiconductor (CMOS) image sensors are used in cameras, cell phones, and other devices for capturing images. Back side illumination (BSI) image sensors are CMOS image sensors in which light enters from a back side of a substrate, rather than the front side. BSI sensors are capable of capturing more of an image signal than front side illumination sensors due to a reduced reflection of light.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to manufacturing methods for semiconductor devices and BSI sensors. Novel methods of forming dielectric grids on a back side of a workpiece of semiconductor devices and BSI sensors will be described herein.

Figure 1:
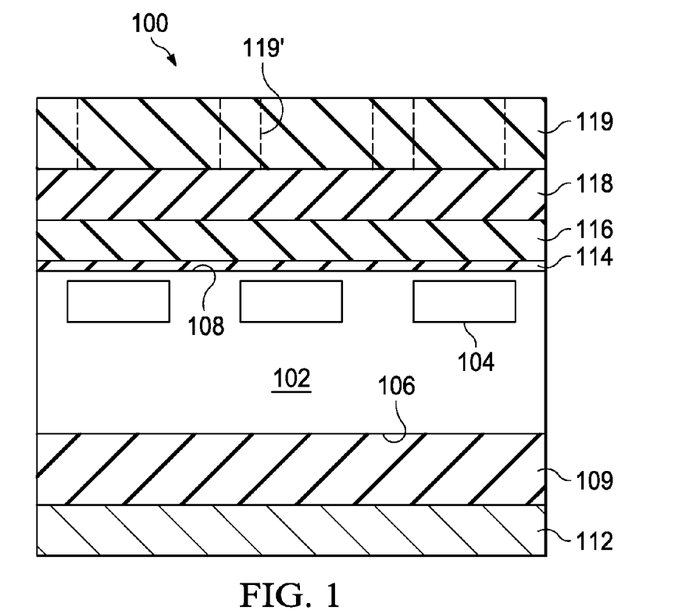
FIGS. 1 through 4 show cross-sectional views of a method of forming a dielectric grid on a back side of a workpiece at various stages of manufacturing in accordance with some embodiments of the present disclosure.

FIGS. 1 through 4 show cross-sectional views of a method of forming a grid 110 (see FIG. 4) on a back side 108 of a workpiece 102 at various stages of manufacturing in accordance with some embodiments of the present disclosure. To manufacture a semiconductor device 100, first, the workpiece 102 is provided. The workpiece 102 may include a semiconductor substrate comprising silicon or other semiconductor materials and may be covered by an insulating layer, for example. The workpiece 102 may include active components or circuits, not shown. The workpiece 102 may comprise silicon oxide over single-crystal silicon, for example. The workpiece 102 may include conductive layers or other semiconductor elements, such as transistors, diodes, capacitors, resistors, inductors, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples. The workpiece 102 comprises a silicon wafer having a thickness of about 2 to 4 µm after forming the various material layers thereon, as shown in FIG. 1. Alternatively, the workpiece 102 may comprise other dimensions.

A plurality of integrated circuits 104 is formed within the workpiece 102, as shown in FIG. 1. In some embodiments, a single integrated circuit 104 is formed within the workpiece 102 (not shown). The single integrated circuit 104 or the plurality of integrated circuits 104 comprises an array of BSI sensors in some embodiments. The workpiece 102 includes a front side 106 and a back side 108 that is opposite the front side 106. The integrated circuits 104 are disposed proximate the back side 108 of the workpiece 102 in some embodiments. In other embodiments, the integrated circuits 104 are disposed proximate the front side 106 of the workpiece 102. In some embodiments, the integrated circuits 104 include one or more photodiodes, e.g., the integrated circuits 104 may comprise an array of a plurality of photodiodes that are adapted to sense light 130 (not shown in FIG. 1; see FIG. 6) that enters the semiconductor device 100 from the back side 108 of the workpiece 102, to be described further herein.

The front side 106 of the workpiece 102 comprises a bottom side of the workpiece 102 in the view shown in FIG. 1. The back side 108 of the workpiece 102 comprises a top side of the workpiece 102 in the view shown in FIG. 1. The integrated circuits 104 or groups of the integrated circuits 104 on the workpiece 102 will later be singulated into individual dies in some embodiments, not shown in the drawings.

The grid 110 (not shown in FIG. 1; see FIGS. 2 through 4) may be formed before, or after, the integrated circuits 104 are formed within the workpiece 102. Portions of the integrated circuits 104 may be formed on the front side 106 of the workpiece 102, and the grid 110 may be formed on the back side 108 of the workpiece 102, and then the remainder of the integrated circuits 104 may be formed on the front side 106 of the workpiece 102 in other embodiments.

The integrated circuits 104 formed within the workpiece 102 are not shown in detail in the figures. The integrated circuits 104 may comprise electronic components such as transistors, diodes, photodiodes, resistors, capacitors, inductors, conductive lines and vias, and/or other devices. The integrated circuits 104 may comprise one or more functions, such as logic, memory, processors, and/or other functions and/or circuitry. The integrated circuits 104 comprise portions of a BSI sensor, such as pixel units and wiring layers, in some embodiments, to be described further herein.

In some embodiments, one or more insulating material layers 109 are formed on the front side 106 of the workpiece 102, as shown in FIG. 1. The insulating material layers 109 comprise an inter-layer dielectric (ILD) in some embodiments, for example. The insulating material layers 109 may comprise low dielectric constant materials having a dielectric constant less than a dielectric constant of $SiO_2$, insulating materials such as $SiO_2$, SiN, SiC, other dielectric materials, or combinations and multiple layers thereof, as examples.

In some embodiments, one or more conductive material layers 112 are formed over the insulating material layers 109. The conductive material layers 112 comprise an inter-metal layer (IML) in some embodiments, for example. The conductive material layers 112 comprise wiring layers disposed within one or more insulating materials. The wiring layers may comprise Cu, Al, and/or other conductive materials commonly used for interconnects. The conductive material layers 112 may be formed in a back end of line (BEOL) process, for example. Alternatively, the insulating material layers 109 and conductive material layers 112 may comprise other materials and functions, and the insulating material layers 109 and/or conductive material layers 112 may not be included in some embodiments.

In some embodiments, an insulating material 114 is formed over the back side 108 of the workpiece 102. The insulating material 114 comprises an anti-reflective coating (ARC) in some embodiments that comprises a material adapted to dampen reflected light from surfaces and material layers in subsequent photolithography processes. The insulating material 114 may comprise a thickness of about 1 to 10 nm of $SiO_2$, as an example, although alternatively, the insulating material 114 may comprise other materials and dimensions. In some embodiments, the insulating material 114 comprises a thickness of about 10 nm or less. Insulating material 114 is not included in some embodiments. Insulating material 114 is also referred to herein, e.g., in some of the claims, as a fourth insulating material 114.

An insulating material 116 is formed over the insulating material 114, or over the back side 108 of the workpiece 102 if the insulating material 114 is not included, also shown in FIG. 1. The insulating material 116 is also referred to herein, (e.g., in some of the claims) as a first insulating material. The insulating material 116 comprises $HfO_x$, $TaO_x$, $ZrO_x$, $LaO_x$, $AlO_x$, or combinations or multiple layers thereof in some embodiments. The insulating material 116 comprises a metal oxide in some embodiments. In other embodiments, the insulating material 116 comprises a high dielectric constant (k) insulating material having a dielectric constant or k value greater than a dielectric constant of silicon dioxide, which is about 3.9. In some embodiments, the insulating material 116 has a dielectric constant that is less than a dielectric constant of a subsequently deposited insulating material 118, also shown in FIG. 1. The insulating material 116 comprises a thickness of about 10 nm to about 100 nm in some embodiments, for example. Alternatively, the insulating material 116 may comprise other materials and dimensions.

An insulating material 118 is deposited over the back side 108 of the workpiece 102. For example, the insulating material 118 is formed over the insulating material 116, as shown in FIG. 1. The insulating material 118 is also referred to herein (e.g., in the claims) as a second insulating material. The insulating material 118 comprises a material layer from which at least a portion of the grid 110 will be formed in accordance with some embodiments, using a patterning and/or lithography process. The insulating material 118 comprises $SiO_x$, $SiN_x$, SiC, or combinations or multiple layers thereof in some embodiments. The insulating material 118 comprises a thickness of several nm to about 100 nm in some embodiments. The insulating material 118 comprises a dielectric constant (k value) of about 10 or less in some embodiments. Alternatively, the insulating material 118 may comprise other materials, dimensions, and k values.

A layer of photoresist 119 is formed over the insulating material 118, also shown in FIG. 1. The layer of photoresist 119 is patterned using lithography with a desired pattern for the grid 110. The layer of photoresist 119 may be patterned by exposing the layer of photoresist 119 to energy or light transmitted through or reflected from a lithography mask (not shown) having a desired pattern for the grid 110 thereon. The layer of photoresist 119 is then developed, and exposed (or unexposed, depending on whether the layer of photoresist 119 comprises a positive or negative photoresist) portions of the layer of photoresist 119 are ashed and/or etched away, leaving patterns in the layer of photoresist 119, as shown in phantom (e.g., in dashed lines) in FIG. 1 at 119'.

Figure 2:
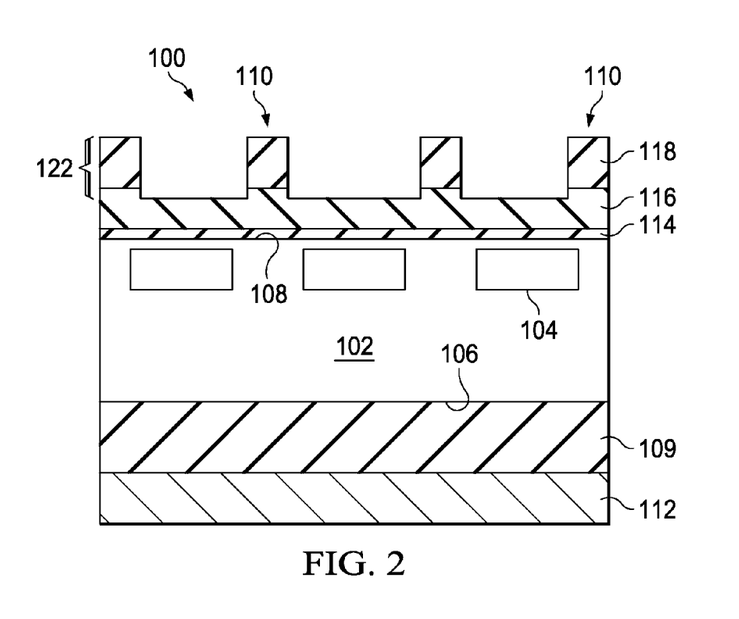

The patterned layer of photoresist 119 is then used as an etch mask during an etch process, and portions of the insulating material 118 are etched away. A top portion of insulating material 116 is also etched away in some embodiments. Less than about 10 nm of the insulating material 116 is etched away in some embodiments, for example. Alternatively, the amount of the insulating material 116 that is removed may comprise other dimensions. The patterned insulating material 118 comprises the grid 110 in some embodiments. In other embodiments, the patterned insulating material 118 and the top portion of insulating material 116 comprise the grid 110, as shown in FIG. 2. The grid 110 is also referred to herein as a dielectric grid 110. The layer of photoresist 119 is then removed.

Figure 3:
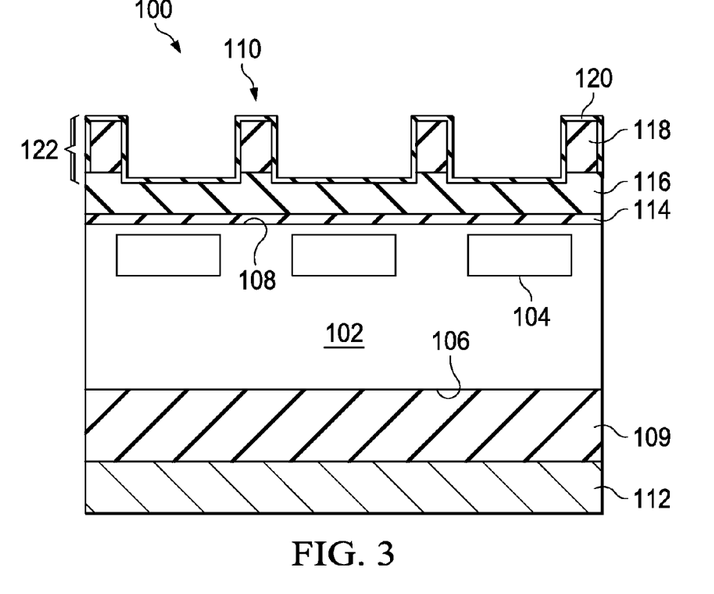

An insulating material 120 is then formed over the patterned insulating material 118, as shown in FIG. 3. In embodiments wherein the top portion of insulating material 116 is also patterned, the insulating material 120 is also formed over the exposed sidewalls of the top portion of insulating material 116, in some embodiments. In other embodiments, the insulating material 120 is not formed on the exposed sidewalls of the top portion of insulating material 116. The insulating material 120 is also formed on exposed top surfaces of insulating material 116, as shown in FIG. 3. The insulating material 120 is substantially conformal and lines the top surfaces and sidewalls of patterned insulating material 118, in some embodiments.

In some embodiments, patterning the insulating material 118 exposes a portion of the insulating material 116 between a plurality of members 122 of the grid 110, as shown in FIG. 2. Insulating material 120 is formed over the patterned insulating material 118 and also over the exposed portion of insulating material 116, as shown in FIG. 3. Insulating material 120 comprises a portion of the grid 110 in some embodiments. In some embodiments, insulating material 120 is not included, and insulating material 120 does not comprise a portion of the grid 110, as another example.

Insulating material 120 is also referred to herein, e.g., in some of the claims, as a third insulating material. In some embodiments, the third insulating material 120 comprises an insulating material having a higher dielectric constant (k) than a dielectric constant (k value) of the second insulating material 118. Insulating material 120 comprises a metal oxide in some embodiments, for example. Insulating material 120 comprises $HfO_x$, $TaO_x$, $ZrO_x$, $LaO_x$, $AlO_x$, or combinations or multiple layers thereof in some embodiments. Insulating material 120 comprises a high-k dielectric capping material in some embodiments, as another example. Insulating material 120 comprises a thickness of about 2 nm to about 10 nm in some embodiments, for example. In some embodiments, the insulating material 120 comprises a high k insulating material having a k value greater than a dielectric constant of silicon dioxide, which is about 3.9. Alternatively, the insulating material 120 may comprise other materials, dimensions, and k values.

In some embodiments, insulating material 120 comprises the same material as insulating material 116. In other embodiments, insulating material 120 comprises a different material than insulating material 116.

The various insulating materials 114, 116, 118, and 120 may be formed using deposition techniques such as chemical vapor deposition (CVD), physical vapor deposition (PVD), or atomic layer deposition (ALD), as examples. Alternatively, other methods may be used to form the insulating materials 114, 116, 118, and 120.

Figure 4:
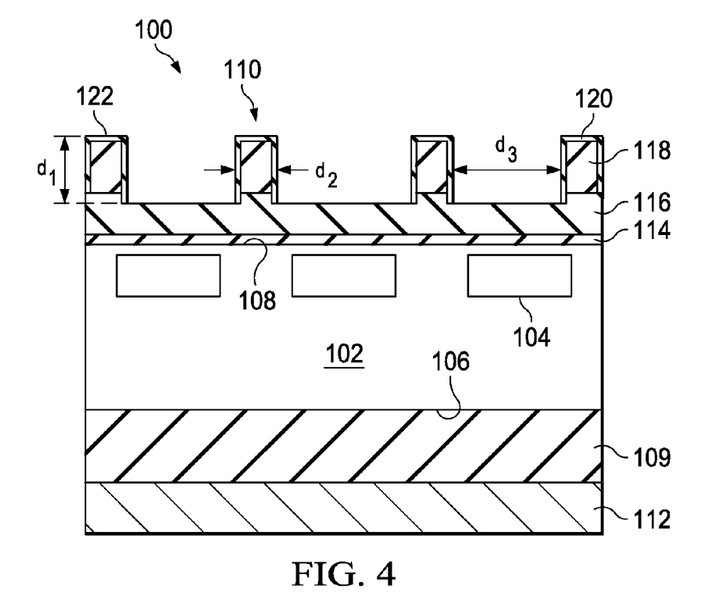

In some embodiments, if included in the manufacturing process flow and structure, the insulating material 120 disposed on the top surfaces of insulating material 116 is left remaining, as shown in FIG. 3. In other embodiments, insulating material 120 is removed from over the top surfaces of insulating material 116 using a lithography process, as shown in FIG. 4. Insulating material 120 is removed from over the exposed portion of insulating material 116 between the plurality of members 122 of the grid 110, in some embodiments, for example. The same lithography mask used to pattern insulating material 118 may advantageously be used to remove the insulating material 120 from over the top surfaces of insulating material 116 in some embodiments, for example.

The pattern in insulating material 118 and in the top portion of insulating material 116 in some embodiments, and also in insulating material 120 that lines insulating material 118 and/or insulating material 116, comprises a grid shape. Some dimensions of the grid 110 are also illustrated in the cross-sectional view of FIG. 4. The grid 110 comprises a plurality of members 122 (also referred to herein as members 122a and 122b; see FIG. 5).

Figure 5:
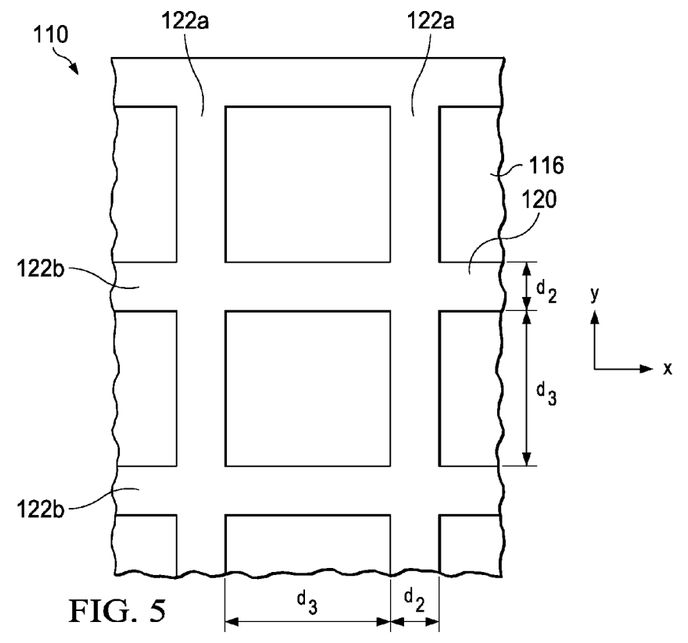
FIG. 5 is a bottom view of a portion of the grid in accordance with an embodiment.

FIG. 5 is a bottom view (e.g., a bottom view of a back side 108 of the semiconductor device 100, which is a top view of the semiconductor device 100 shown in FIGS. 1 through 4) of a portion of the grid 110. The grid 110 comprises a plurality of members 122a and 122b that extend lengthwise in an x direction and a y direction in a bottom view of the back side 108 of the workpiece 102. Members 122a extend in a y direction and members 122b extend in an x direction in the view shown. The grid 110 comprises a plurality of members 122, 122a, and 122b of at least insulating material 118 that extend lengthwise in an x direction and a y direction in a bottom view of the back side 108 of the workpiece 102.

The plurality of members 122, 122a, and 122b comprise a thickness comprising dimension $d_1$ (see FIG. 4) in a cross-sectional view of the workpiece 102 of about 100 nm to about 250 nm in some embodiments. The members 122, 122a, and 122b comprise a thickness that is substantially the same as the thickness of the insulating material 118, the thickness of the top portion of insulating material 116, and the thickness of insulating material 120, for example. The members 122, 122a, and 122b also comprise a width or thickness comprising dimension $d_2$ in a bottom view and cross-sectional of the workpiece 102 (see FIGS. 4 and 5) of about 60 nm to about 120 nm. The members 122, 122a, and 122b may be spaced apart by a dimension $d_3$ that comprises about 800 nm to about 2,000 nm. Dimensions $d_2$ and $d_3$ may be substantially the same in some embodiments (not shown). Alternatively, dimensions $d_2$ and $d_3$ may be different. Dimension $d_3$ may be about twice or greater than dimension $d_2$ in some embodiments, for example. Alternatively, dimensions $d_1$, $d_2$, and $d_3$ of the members 122, 122a, and 122b of the dielectric grid 110 may comprise other values.

Figure 6:
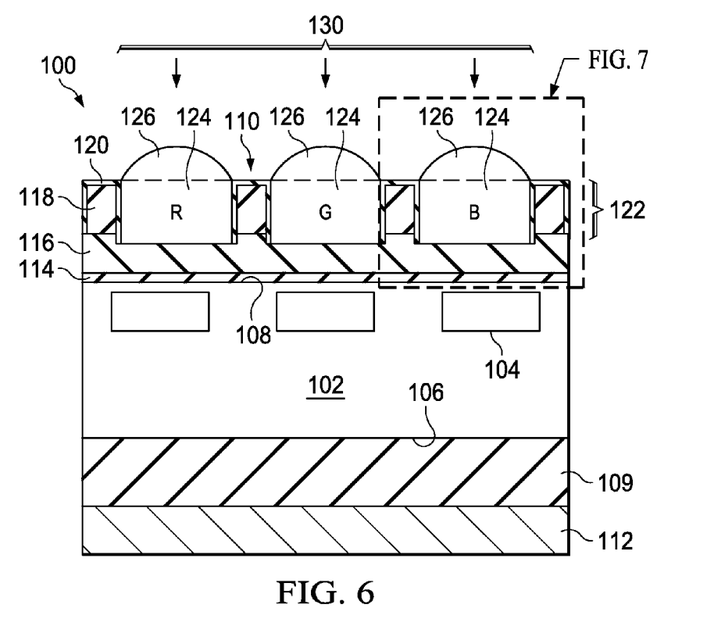
FIG. 6 is a cross-sectional view of a back side illumination (BSI) sensor including the grid in accordance with an embodiment.

A color filter material 124 is formed over the grid 110, as shown in FIG. 6 in a cross-sectional view, and a lens material 126 is formed over the color filter material 124. The color filter material 124 is disposed over a portion of the insulating material 116 between the plurality of members 122 of the grid 110. The color filter material 124 is adapted to separate light transmitted to a red-green-blue (R, G, or B) original element when utilized as a back side illumination image sensor, for example. The color filter material 124 comprises a photosensitive material in some embodiments, as another example. The lens material 126 may comprise a micro-lens material in some embodiments, as an example. Alternatively, the color filter material 124 and the lens material 126 may comprise other materials.

After the grid 110 is formed and the color filter material 124 and lens material 126 are formed over the grid 110, an integrated circuit 104 or at least a portion of an integrated circuit 104 may be formed on the front side 106 of the workpiece 102. Alternatively, the integrated circuit 104 or at least a portion thereof may be formed before the grid 110 is formed and the color filter material 124 and lens material 126 are formed over the grid 110.

Note that before some or all of the manufacturing process steps illustrated in the drawings and described herein, the workpiece 102 may be coupled to a carrier wafer (not shown). For example, a carrier wafer may be coupled to the conductive material layers 112 disposed on the front side 106 of the workpiece 102, shown in FIG. 1. After the manufacturing processes described herein and after the manufacturing stage shown in FIG. 6, the semiconductor devices 100 and/or BSI sensors may be removed from the carrier wafer and singulated, and then packaged in single packages, multi-chip packages, or directly to boards or other objects or supports in an end application, as examples.

Figure 7:
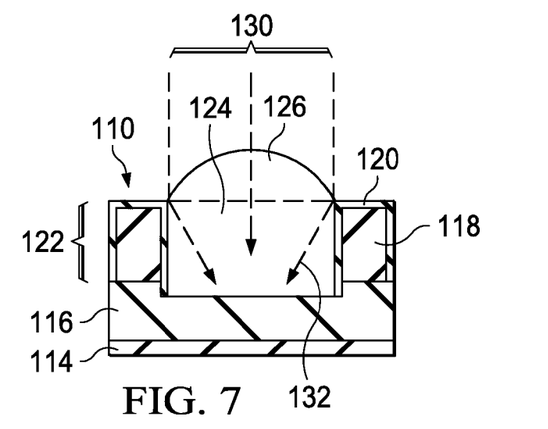
FIG. 7 is a more detailed view of a portion of the BSI sensor shown in FIG. 6.

FIG. 7 is a more detailed view of a portion of the BSI sensor shown in FIG. 6. Light 130 enters the back side 108 (see FIG. 6) of the workpiece 102 and enters the lens material 126. The lens material 126 and the color filter material 124 alter or refract the direction of the light 130, as shown at 132. The members 122 of the grid 110 comprise substantially straight sidewalls in some embodiments, as illustrated in FIGS. 6 and 7.

Figure 8:
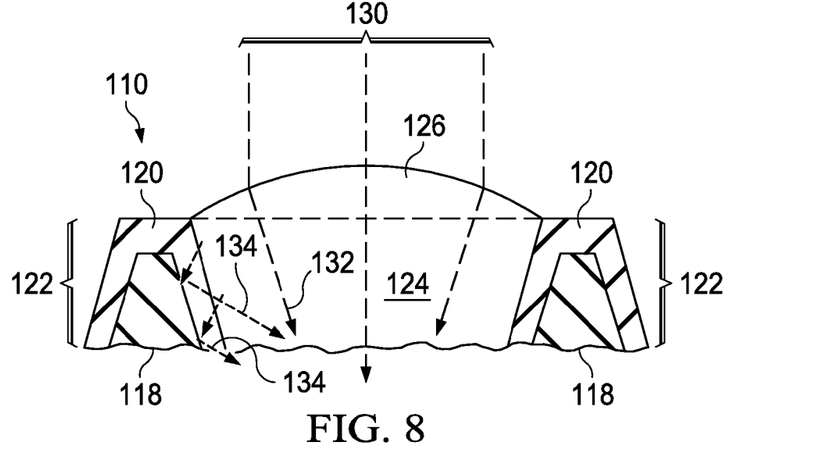
FIG. 8 is a more detailed view of a portion of a BSI sensor in accordance with other embodiments, wherein the grid members comprise tapered sidewalls.

Alternatively, the members 122 of the grid 110 may comprise tapered sidewalls, as illustrated in FIG. 8, which is a more detailed view of a portion of a BSI sensor in accordance with other embodiments. The grid 100 members 122 comprise tapered sidewalls, wherein the members 122 of the grid 100 are wider at the bottom than at the top proximate the lens material 126. An angle of the tapered sidewalls of the members 122 with respect to a horizontal surface of the semiconductor device 100 in the view shown in FIG. 8 may comprise about 75 to 85 degrees, for example. Alternatively, the angle of the tapered sidewalls of the members 122 may comprise other values and dimensions. The tapered sidewalls of the members 122 may result from a process window for various processes used to form and pattern the insulating materials 116, 118, and/or 120, for example.

Various paths of light 130 that enters the lens material 126 are also shown in FIG. 8. Some of the light 130 direction is altered or refracted by the color filter material 124, as shown at 132. Other light 130 impinges upon the tapered sidewalls of the members 122 of the grid 110 and is further altered or refracted by the tapered sidewalls of the members 122, as shown at 134.

Figure 9:
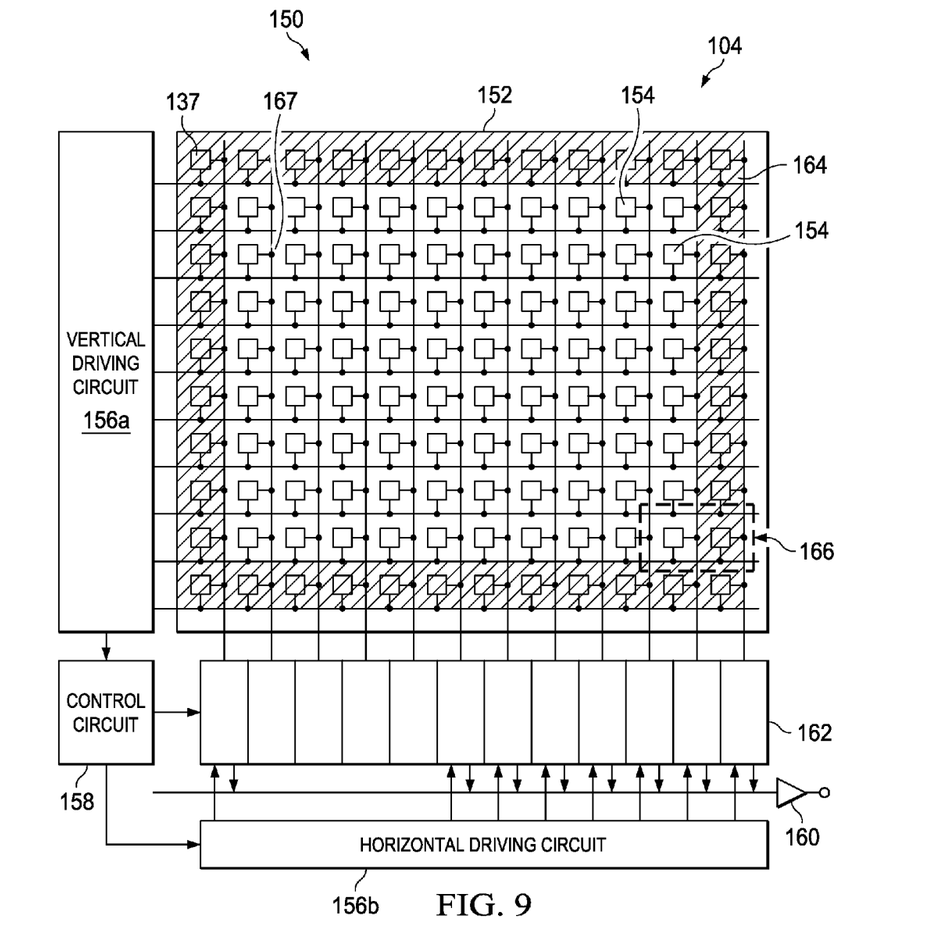
FIG. 9 is a schematic of a BSI sensor in which the grid may be implemented in accordance with some embodiments.

FIG. 9 is a schematic of a BSI sensor 150 in which the novel grids 110 described herein can be implemented in accordance with some embodiments. The BSI sensor 150 includes a workpiece 102 (not shown in FIG. 9; see FIG. 6) and a pixel unit 152 comprising an imaging region disposed over the workpiece 102. The pixel unit 152 includes a plurality of pixels 154 that include photoelectric conversion elements and are arranged in an array in two dimensions over the workpiece 102. The pixel unit 152 includes a first region 167 that comprises a central effective pixel region and a second region 137 comprising an optical black (OPB) region that is positioned outside the effective pixel region 167 along the perimeter. The second region 137 is shaded with hatching in the schematic shown in FIG. 9. The OPB region 137 detects a black level and may be covered by a light-shielding element or film, such as portions of the grid 110. Alternatively, the light-shielding element or film may be comprised in an additional material layer disposed over the workpiece 102, for example, not shown.

The pixels 154 include photodiodes that function as photoelectric conversion elements and a plurality of pixel transistors comprising metal-oxide semiconductor (MOS) transistors. The transistors may comprise a transfer transistor, a reset transistor, and an amplification transistor, and a selection transistor for each pixel 154, as examples.

The BSI sensor 150 includes peripheral circuitry that includes a vertical driving circuit 156a, a horizontal driving circuit 156b, a plurality of column signal processing circuits 162, a control circuit 158, an output circuit 160, and input/output terminals (not shown). The control circuit 158 is adapted to receive an input clock and data for controlling an operation mode. The control circuit 158 also outputs data including internal information of the BSI sensor 150.

The vertical driving circuit 156a receives signals from the control circuit 158, sequentially selectively scans the pixels 154 in the pixel unit 152 in rows in a vertical direction, and supplies pixel signals to the column signal processing circuits 162 based on a signal charge generated in accordance with an amount of received light (see light 130 in FIGS. 6 through 8) in the photodiodes of the pixels 154.

The column signal processing circuits 162 comprise signal processors that are adapted to remove noise, amplify signals and perform A-D conversions, as examples. The horizontal driving circuit 156b is adapted to sequentially select the column signal processing circuits 162 for outputting pixel signals to the output circuit 160. The output circuit 160 may be adapted to perform signal processing on signals received from column signal processing circuits 162, output the signals, and/or perform buffering, black-level adjustment, column variation correction, and various other digital signal processes, as examples, depending on the design of the BSI sensor 150. Alternatively, the BSI sensor 150 may be arranged in other configurations, and the peripheral circuitry may be adapted to perform other functions.

In some embodiments, the grid 110 is formed in a central region of the integrated circuit 104 proximate the pixels 154 in region 167, but the grid 110 is not formed in region 137 (not shown).

Referring again to FIG. 6, in an operation mode of a semiconductor device 100 comprising a BSI sensor 150 such as the one shown in FIG. 9, incident light 130 enters from the back side 108 of the workpiece 102 and is bent by the lenses formed by the lens material 126 to be focused onto the photodiodes of the integrated circuits 104, after color components of the light 130 are separated by the color filter material 124. The photodiodes perform photoelectric conversion of the incident light 130, and the circuit in the schematic shown in FIG. 9 is used to produce and output an image received.

Figure 10:
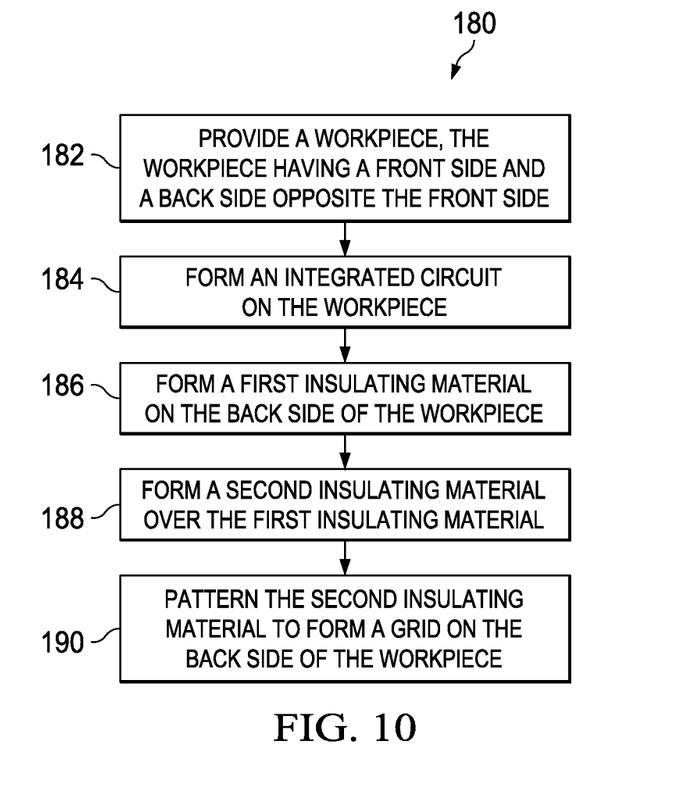
FIG. 10 is a flow chart illustrating a method of manufacturing a semiconductor device including the grid in accordance with some embodiments.

FIG. 10 is a flow chart 180 of a method of manufacturing a semiconductor device 100 in accordance with some embodiments of the present disclosure. In step 182, a workpiece 102 is provided that has a front side 106 and a back side 108 opposite the front side 106 (see also FIG. 1). In step 184, an integrated circuit 104 is formed on the workpiece 102. In step 186, a first insulating material 116 is formed on the back side 108 of the workpiece 102. In step 188, a second insulating material 118 is formed over the first insulating material 116. In step 190, the second insulating material 118 is patterned to form a grid 110 on the back side 108 of the workpiece 102 (see also FIG. 2).

Advantages of embodiments of the disclosure include providing novel dielectric grids 110 on the back side 108 of wafers or workpieces 102. The novel dielectric grids 110 improve sensitivity of CMOS image sensors and also improve and increase quantum efficiency (QE). The dielectric grids 110 are inexpensive to implement in a manufacturing process flow. The methods and structures are implementable on back sides of silicon wafers in very large scale integration (VLSI) semiconductor devices. In some embodiments, planarity of the back side of semiconductor devices 100 and BSI sensors is improved by the inclusion of the dielectric grids 110 in the structure.

Total reflection effects and reflected light passing through the novel dielectric grids 110 causes light 130 to be efficiently convergent to red/green/blue photodiode regions of pixels in the BSI sensor array, which significantly increases the QE, light quality, light quantity, and illumination into photodiodes within the workpiece 102, e.g., in bulk silicon. Furthermore, implementing the novel dielectric grids 110 in BSI sensors results in improved signal to noise ratio and less optical cross-talk. The dielectric grids 110 have low light absorption, and the high-k dielectric material of insulating material 120 is advantageously resistant to moisture in some embodiments. The novel manufacturing methods described herein are easily implementable in manufacturing process flows.

In accordance with some embodiments of the present disclosure, a method of manufacturing a semiconductor device includes providing a workpiece, the workpiece having a front side and a back side opposite the front side. An integrated circuit is formed on the workpiece, and a first insulating material is formed on the back side of the workpiece. A second insulating material is formed over the first insulating material, and the second insulating material is patterned to form a grid on the back side of the workpiece.

In accordance with other embodiments, a method of manufacturing a BSI sensor includes providing a workpiece having a front side and a back side opposite the front side, and forming an integrated circuit including an array of back side illumination sensors within the workpiece. The method includes forming a first insulating material over the back side of the workpiece, forming a second insulating material over the first insulating material, and patterning the second insulating material to form a grid on the back side of the workpiece. A third insulating material is formed over the patterned second insulating material and exposed portions of the first insulating material. The third insulating material is a portion of the grid. A color filter material is formed over the grid, and a lens material is formed over the color filter material.

In accordance with other embodiments, a BSI sensor includes a workpiece having a front side and a back side opposite the front side, the workpiece including an array of back side illumination sensors. A first insulating material is disposed over the back side of the workpiece, and a grid is disposed over the first insulating material. The grid includes a plurality of members. The grid includes a patterned second insulating material and a third insulating material disposed over the patterned second insulating material. A color filter material is disposed over a portion of the first insulating material between the plurality of members of the grid. A lens material is disposed over the color filter material.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece, the workpiece having a front side and a back side opposite the front side;
   forming an integrated circuit on the workpiece;
   forming a first insulating material on the back side of the workpiece;
   forming a second insulating material over the first insulating material; and
   patterning the second insulating material to form a grid on the back side of the workpiece.

2. The method according to claim 1, wherein forming the grid comprises forming a plurality of members of the second insulating material that extend lengthwise in an x direction and a y direction in a bottom view of the workpiece.

3. The method according to claim 2, wherein patterning the second insulating material exposes a portion of the first insulating material between the plurality of members of the grid, wherein the method further comprises forming a third insulating material over the patterned second insulating material and the exposed portion of the first insulating material, and wherein the third insulating material comprises a portion of the grid.

4. The method according to claim 3, further comprising removing the third insulating material from over the exposed portion of the first insulating material between the plurality of members of the grid.

5. The method according to claim 3, wherein forming the third insulating material comprises forming an insulating material having a higher dielectric constant (k) than a dielectric constant (k) of the second insulating material.

6. The method according to claim 1, wherein forming the first insulating material comprises forming an insulating material having a higher dielectric constant (k) than a dielectric constant (k) of the second insulating material.

7. The method according to claim 1, wherein patterning the second insulating material further comprises patterning a top portion of the first insulating material, and wherein the patterned top portion of the first insulating material comprises a portion of the grid.

8. A method of manufacturing a back side illumination (BSI) sensor, the method comprising:
   providing a workpiece having a front side and a back side opposite the front side;
   forming an integrated circuit comprising an array of back side illumination sensors within the workpiece;
   forming a first insulating material over the back side of the workpiece;
   forming a second insulating material over the first insulating material;
   patterning the second insulating material to form a grid on the back side of the workpiece;
   forming a third insulating material over the patterned second insulating material and exposed portions of the first insulating material, wherein the third insulating material comprises a portion of the grid;
   forming a color filter material over the grid; and
   forming a lens material over the color filter material.

9. The method according to claim 8, wherein forming the third insulating material comprises forming a metal oxide.

10. The method according to claim 8, wherein forming the first insulating material or forming the third insulating material comprises forming a material selected from the group consisting essentially of $HfO_x$, $TaO_x$, $ZrO_x$, $LaO_x$, $AlO_x$, and combinations thereof.

11. The method according to claim 8, wherein forming the second insulating material comprises forming a material selected from the group consisting essentially of $SiO_x$, $SiN_x$, SiC, and combinations thereof.

12. The method according to claim 8, further comprising forming a fourth insulating material over the back side of the workpiece, before forming the first insulating material.

13. The method according to claim 12, wherein forming the fourth insulating material comprises forming $SiO_2$ having a thickness of about 10 nm or less.

14. The method according to claim 8, wherein forming the integrated circuit comprises forming a plurality of photodiodes in the workpiece.

15. A back side illumination (BSI) sensor, comprising:
   a workpiece having a front side and a back side opposite the front side, the workpiece including an array of back side illumination sensors;
   a first insulating material disposed over the back side of the workpiece;
   a grid disposed over the first insulating material, the grid comprising a plurality of members, the grid comprising a patterned second insulating material and a third insulating material disposed over the patterned second insulating material;

a color filter material disposed over a portion of the first insulating material between the plurality of members of the grid; and a lens material disposed over the color filter material.

16. The BSI sensor according to claim 15, wherein the second insulating material comprises a dielectric constant (k) of about 10 or less.

17. The BSI sensor according to claim 15, wherein the first insulating material or the third insulating material comprises a dielectric constant (k) of greater than about 3.9.

18. The BSI sensor according to claim 15, wherein each of the plurality of members of the grid comprises a thickness in a bottom view of the BSI sensor of about 60 nm to about 120 nm.

19. The BSI sensor according to claim 15, wherein each of the plurality of members of the grid comprises a thickness in a cross-sectional view of the BSI sensor of about 100 nm to about 250 nm.

20. The BSI sensor according to claim 19, wherein each of the plurality of members of the grid comprises substantially straight vertical sidewalls, or wherein each of the plurality of members of the grid comprises tapered sidewalls.

* * * * *